United States Patent
Wu et al.

(10) Patent No.: US 9,917,046 B2
(45) Date of Patent: Mar. 13, 2018

(54) MANUFACTURING METHOD OF A CIRCUIT BOARD HAVING A GLASS FILM

(71) Applicant: Unimicron Technology Corp., Taoyuan (TW)

(72) Inventors: Chien-Te Wu, Tainan (TW); Chien-Tsai Li, Hsinchu (TW); Cheng-Chung Lo, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/201,602

(22) Filed: Jul. 4, 2016

(65) Prior Publication Data
US 2018/0005933 A1 Jan. 4, 2018

(51) Int. Cl.
*H01K 3/10* (2006.01)
*H01L 23/498* (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/6833* (2013.01); *H01L 23/49822* (2013.01); *H01L 23/49827* (2013.01); *H05K 1/0306* (2013.01); *H05K 1/115* (2013.01); *H05K 3/002* (2013.01);
(Continued)

(58) Field of Classification Search
CPC ............ H01L 23/49838; H01L 21/4857; H01L 21/486; H01L 23/49822; H01L 23/49827; H01L 21/6833; H01L 21/4853; H05K 1/0306; H05K 3/0029; H05K 1/115; H05K 3/1275; H05K 3/0023; H05K 3/4007; H05K 3/002; H05K 3/4038; Y10T 29/49126; Y10T 29/49155; Y10T 29/49165

USPC ............ 29/830, 846, 852; 118/728; 257/774
See application file for complete search history.

(56) References Cited

U.S. PATENT DOCUMENTS 6,120,661 A * 9/2000 Hirano .................... C03C 15/00
118/728
8,023,246 B2 9/2011 Shiraiwa et al.
(Continued)

FOREIGN PATENT DOCUMENTS

| TW | 550983 | 9/2003 |
|---|---|---|
| TW | I247049 | 1/2006 |
| TW | I277836 | 4/2007 |

OTHER PUBLICATIONS

"Office Action of Taiwan Counterpart Application", dated May 15, 2017, p. 1-p. 4.

*Primary Examiner* — Donghai D Nguyen
(74) *Attorney, Agent, or Firm* — JCIPRNET

(57) ABSTRACT

Provided is a manufacturing method of a circuit board structure including steps as below. A glass film is provided on an electrostatic chuck (E-chuck). A plurality of first conductive vias are formed in the glass film. A first circuit layer is formed on an upper surface of the glass film, such that the first circuit layer is electrically connected with the first conductive vias. A first polymer layer is formed on the first circuit layer. The first polymer layer covers a surface of the first circuit layer and the upper surface of the glass film. A plurality of second conductive vias are formed in the first polymer layer. A second circuit layer is formed on the first polymer layer, such that the second circuit layer is electrically connected with the second conductive vias. The E-chuck is removed.

9 Claims, 5 Drawing Sheets

(51) Int. Cl.
*H01L 21/683* (2006.01)
*H05K 1/03* (2006.01)
*H05K 3/00* (2006.01)
*H05K 1/11* (2006.01)
*H05K 3/12* (2006.01)
*H05K 3/40* (2006.01)
*H01L 21/48* (2006.01)

(52) U.S. Cl.
CPC ......... *H05K 3/0023* (2013.01); *H05K 3/0029* (2013.01); *H05K 3/1275* (2013.01); *H05K 3/4007* (2013.01); *H05K 3/4038* (2013.01); *Y10T 29/49165* (2015.01)

(56) References Cited

U.S. PATENT DOCUMENTS 8,907,489 B2* 12/2014 Kunimoto ......... H01L 23/49822
                                                                                       257/774
9,445,496 B2* 9/2016 Ma ........................ H01L 21/486

* cited by examiner

MANUFACTURING METHOD OF A CIRCUIT BOARD HAVING A GLASS FILM

BACKGROUND OF THE INVENTION

Field of the Invention

The invention relates to a semiconductor structure and a manufacturing method thereof, and particularly relates to a circuit board structure and a manufacturing method thereof.

Description of Related Art

Since the requirements for portability and multi-function of consumer electronics products are increased, a semiconductor device is moving towards a trend of small size, high performance, and low cost. In this trend, the semiconductor device is required to add more input/output (I/O) pads onto a circuit board in a smaller area. In other words, with a higher integrity of the semiconductor device, the requirements for reliability and yield of semiconductor packaging technology is higher.

A glass substrate is often used as a carrier in a conventional circuit board process, and a multilayer circuit layer and a multilayer dielectric layer are formed on the glass substrate respectively. Then, the glass substrate is de-bonded, so as to form a circuit board structure. However, when the glass substrate is de-bonded, it is easy to cause the problem of warping resulted from the stress issue since the material of the dielectric layer is too soft. The problem of warping may reduce reliability and yield of the product.

SUMMARY OF THE INVENTION

The invention provides a circuit board structure and a manufacturing method thereof, which can solve the problem of warping, so as to improve the reliability and yield of the product.

The invention provides a manufacturing method of a circuit board structure including the following steps. A glass film having an upper surface and a lower surface is provided, and the lower surface of the glass film is disposed on an electrostatic chuck (E-chuck). A plurality of first conductive vias are formed in the upper surface of the glass film. A first circuit layer is formed on the upper surface of the glass film, such that the first circuit layer is electrically connected with the first conductive vias. A first polymer layer is formed on the first circuit layer. The first polymer layer covers a surface of the first circuit layer and the upper surface of the glass film. A plurality of second conductive vias are formed in the first polymer layer. The second conductive vias are electrically connected with the first circuit layer. A second circuit layer is formed on the first polymer layer, such that the second circuit layer is electrically connected with the second conductive vias. The electrostatic chuck is removed, so as to form a first circuit board structure.

According to an embodiment of the invention, the step of forming the first conductive vias in the glass film is as below. A laser light is irradiated to the glass film, so as to form a plurality of modified regions in the glass film. The regions outside of the modified regions are non-modified regions. An etching process is performed to remove the glass film in the modified regions, so as to form a plurality of first via holes in the glass film. The first via hole penetrates the upper surface and the lower surface of the glass film. A conductive material is filled in the first via holes.

According to an embodiment of the invention, an etching rate of the etching process on the modified regions is more than an etching rate of the etching process on the non-modified regions.

According to an embodiment of the invention, an etching selectivity of the modified regions to the non-modified regions is between 20:1 and 100:1.

According to an embodiment of the invention, the step of forming the second conductive vias in the first polymer layer is as below. A patterned mask layer is formed on the first polymer layer. The patterned mask layer is used as a mask to perform a lithography process, so as to form a plurality of second via holes in the first polymer layer. A conductive material is filled in the second via holes.

According to an embodiment of the invention, a material of the first polymer layer includes a photosensitive material. The photosensitive material includes a chemically amplified photosensitive material.

According to an embodiment of the invention, a thickness of the glass film is between 5 micrometers and 100 micrometers. Preferably, the thickness of the glass film may be 10 micrometers, 20 micrometers, 30 micrometers, 50 micrometers, or 80 micrometers, for example.

According to an embodiment of the invention, after removing the electrostatic chuck, the manufacturing method further includes performing a bumping process, so as to form a plurality of bumps on the second circuit layer.

According to an embodiment of the invention, after removing the electrostatic chuck, the manufacturing method further includes the following steps. The first circuit board structure is flipped on the electrostatic chuck, such that the lower surface of the glass film is upward. A third circuit layer is formed on the lower surface of the glass film, such that the third circuit layer is electrically connected with the first conductive vias. A second polymer layer is formed on the third circuit layer. The second polymer layer covers a surface of the third circuit layer and the lower surface of the glass film. A plurality of third conductive vias are formed in the second polymer layer. The third conductive vias are electrically connected with the third circuit layer. A fourth circuit layer is formed on the second polymer layer, such that the fourth circuit layer is electrically connected with the third conductive vias. The electrostatic chuck is removed.

The invention provides a circuit board structure manufactured by the manufacturing method of the circuit board structure. The circuit board structure includes a glass film, a plurality of first conductive vias, a first circuit layer, a first polymer layer, a plurality of second conductive vias, and a second circuit layer. The first conductive vias are located in the glass film. The first circuit layer is located on the glass film. The first circuit layer is electrically connected with the first conductive vias. The first polymer layer is located on the first circuit layer. The second conductive vias are located in the first polymer layer. The second conductive vias are electrically connected with the first circuit layer. The second circuit layer is located on the first polymer layer. The second circuit layer is electrically connected with the second conductive vias.

Based on the above, the invention provides a thinner glass film on the electrostatic chuck. Then, the laser light is irradiated to the glass film, and the etching process is performed, so as to form the plurality of via holes in the glass film. Thereafter, the conductive material is filled in the via holes, so as to form the plurality of conductive vias. After that, the circuit layer is formed on the glass film, and the electrostatic chuck is removed. In other words, the step of de-bonding the glass substrate can be omitted in the invention, so as to complete a redistribution layer (RDL) structure. Therefore, the problem of warping of the redistribution layer structure caused by the stress generated from debonding can be avoided in the invention, thereby improving the reliability and yield of the product.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
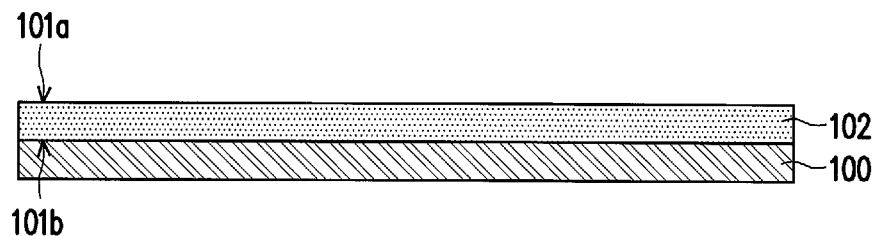
FIG. 1A to FIG. 1H are schematic cross-sectional diagrams of a manufacturing process of a circuit board structure according to a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1A to FIG. 1H are schematic cross-sectional diagrams of a manufacturing process of a circuit board structure according to a first embodiment of the invention.

Referring to FIG. 1A, a glass film 102 is provided on an electrostatic chuck 100, wherein the glass film 102 has an upper surface 101a and a lower surface 101b opposite to each other. In particular, the electrostatic chuck 100 can absorb the lower surface 101b of the glass film 102 by electrostatic force, such that the glass film 102 is held on the electrostatic chuck 100 without warping. In an embodiment, a thickness of the glass film 102 may be between 5 micrometers and 100 micrometers, for example. Preferably, the thickness of the glass film may be 10 micrometers, 20 micrometers, 30 micrometers, 50 micrometers, or 80 micrometers, for example. A size of the glass film 102 may be adjusted according to the needs of a user.

Figure 1B:
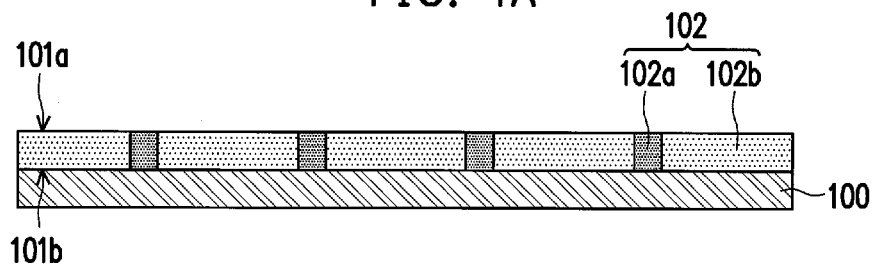

Referring to FIG. 1B, a laser light is irradiated to the glass film 102, so as to form a plurality of modified regions 102a in the glass film 102. The regions outside of the modified regions 102a are non-modified regions 102b. In an embodiment, the laser light may be a carbon dioxide ($CO_2$) laser, for example. A wavelength of the laser light may be between 9 micrometers and 11 micrometers. An energy of the laser light may be between 200 mW and 10 mW. Preferably, the laser energy may be 150 mW, 100 mW, 70 mW, 50 mW, 30 mW, or 20 mW, for example. The process time of the laser light may be between 50 minutes and 10 minutes. Preferably, the laser process time may be 40 minutes, 30 minutes, or 20 minutes, for example.

Figure 1C:
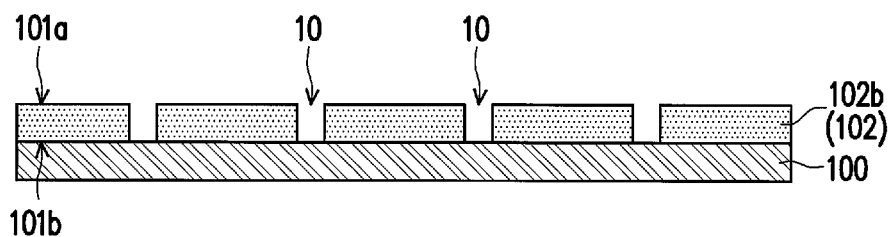

Referring to FIG. 1B and FIG. 1C, an etching process is performed to remove the glass film 102 in the modified regions 102a. A plurality of first via holes 10 are formed in the glass film 102. The first via holes 10 penetrate the upper surface 101a and the lower surface 101b of the glass film 102. In particular, since an etching rate of the etching process on the modified regions 102a is more than an etching rate of the etching process on the non-modified regions 102b, the glass film 102 in the modified regions 102a can be completely removed, so as to expose the surface of the electrostatic chuck 100. However, the invention is not limited to. In other embodiments, a plurality of blind via holes (not shown) may be formed in the glass film 102, and the surface of the electrostatic chuck 100 is not exposed. In an embodiment, the etching process includes a wet etching process. The etchant used in the wet etching process may be hydrofluoric acid (HF), diluted hydrofluoric acid (DHF), or a buffered oxide etchant (BOE), for example. In an embodiment, an etching selectivity of the modified region 102a to the non-modified region 102b may be between 20:1 and 100:1. However, the invention is not limited to.

Figure 1D:
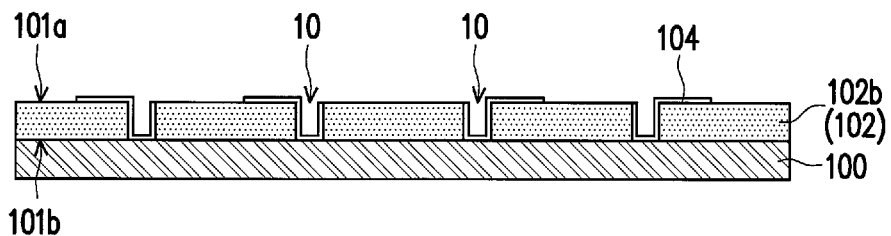

Referring to FIG. 1C and FIG. 1D, a seed layer 104 is formed on a portion of the upper surface 101a of the glass film 102 and on a surface of the first via holes 10. Specifically, a seed material layer (not shown) is formed on the glass film 102 first. The seed material layer conformally covers the upper surface 101a of the glass film 102 and the surface of the first via holes 10. Then, a lithography process and an etching process are performed to remove a portion of the seed material layer, so as to form the seed layer 104. In an embodiment, a material of the seed layer 104 includes a metal material, metal nitride, metal silicide, or a combination thereof. The metal material may be titanium, copper, nickel, palladium, gold, silver, or a combination thereof, for example. A forming method of the seed layer 104 includes physical vapor deposition, chemical vapor deposition, an electroplating process, or an electroless plating process. The physical vapor deposition may be sputtering deposition or vapor deposition, for example.

Figure 1E:
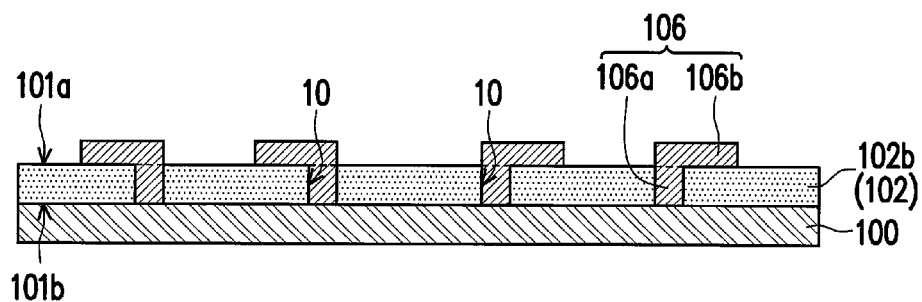

Referring to FIG. 1D and FIG. 1E, an electroplating process or an electroless plating process is performed, so as to form a conductive structure 106 on a surface of the seed layer 104. Specifically, the conductive structure 106 includes a first conductive via 106a filled in the first via hole 10 and a first circuit layer 106b disposed on the upper surface 101a of the glass film 102. The first conductive via hole 106a is electrically connected with the first circuit layer 106b. In an embodiment, a material of the conductive structure 106 includes a metal material. The metal material may be titanium, copper, nickel, palladium, gold, silver, or a combination thereof, for example. Incidentally, the seed layer 104 may be regarded as a part of the conductive structure 106. Thus, the seed layer 104 is not shown in FIG. 1E.

Figure 1F:
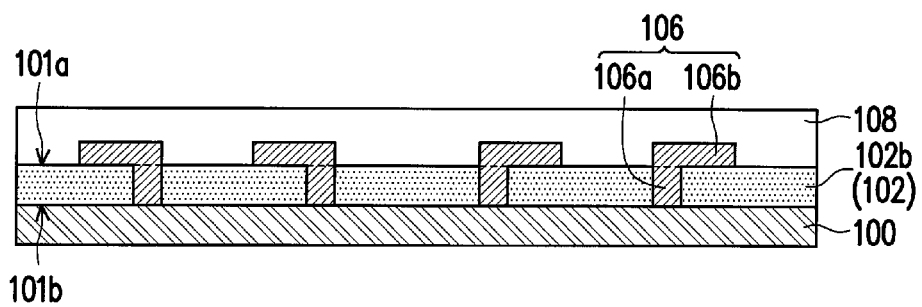

Referring to FIG. 1F, a first polymer layer 108 is formed on the first circuit layer 106b. The first polymer layer 108 covers a surface of the first circuit layer 106b and the upper surface 101a of the glass film 102. In an embodiment, a material of the first polymer layer 108 includes a photosensitive material. The photosensitive material may be a chemically amplified photosensitive material, for example. In an embodiment, a coefficient of thermal expansion (CTE) of the chemically amplified photosensitive material may be between 45 ppm/° C. and 55 ppm/° C. A thickness of the first polymer layer 108 may be between 5 micrometers and 20 micrometers, and a forming method thereof may be spray coating.

Figure 1G:
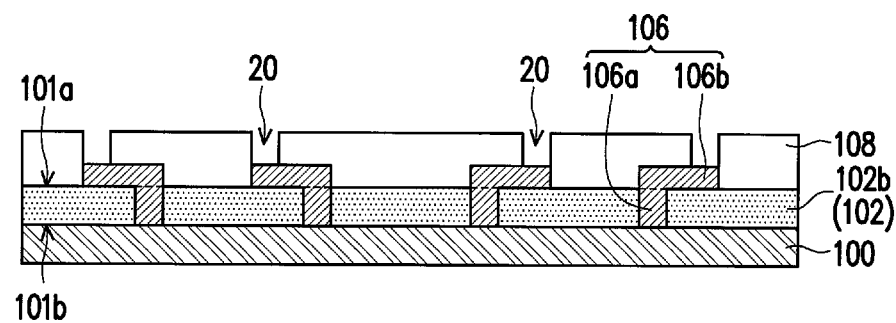

Referring to FIG. 1F and FIG. 1G, a patterned mask layer (not shown) is formed on the first polymer layer 108. Thereafter, the patterned mask layer is used as a mask to perform a lithography process, so as to form a plurality of second via holes 20 in the first polymer layer 108. A portion of the surface of the first circuit layer 106b is exposed by the second via holes 20. It should be mentioned that, since the chemically amplified photosensitive material is used as the first polymer layer 108 in the embodiment, an exposure energy of the lithography process may be less than 250 mJ during the lithography process. Also, exposure time can be shortened. Therefore, the process time can be reduced to increase the yield in the embodiment.

Figure 1H:
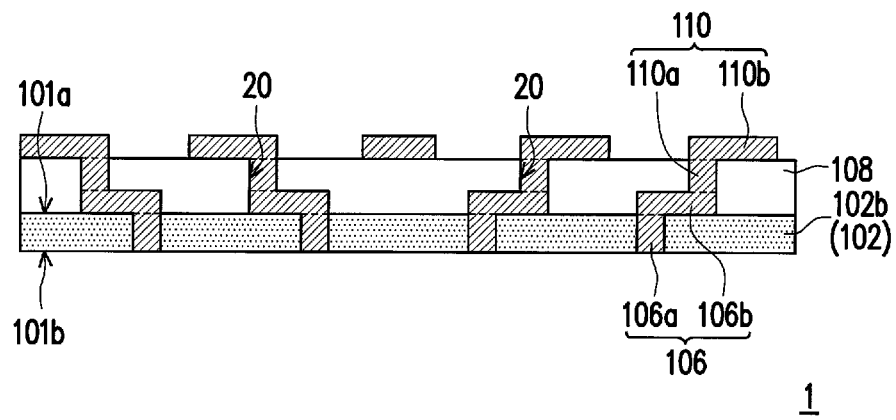

Referring to FIG. 1H, a seed layer (not shown) is formed on a surface of the first polymer layer 108 and on a surface of the second via hole 20, and an electroplating process or an electroless plating process is performed, so as to form a conductive structure 110 on a surface of the seed layer (not shown). A material and a forming method of the conductive structure 110 is similar to the material and the forming method of the conductive structure 106 in FIG. 1E, and is not described in detail here. Similarly, the conductive structure 110 includes a second conductive via 110a filled in the second via hole 20 and a second circuit layer 110b disposed on the first polymer layer 108. The second circuit layer 110b may be electrically connected with the conductive structure 106 by the second conductive via 110a. Thereafter, the electrostatic chuck 100 is removed to expose the lower surface 101b of the glass film 102, so as to form a first circuit board structure 1.

It should be mentioned that, the thinner glass film 102 is absorbed and held on the electrostatic chuck 100 in the embodiment, such that the problem of flexibility is not produced when the conductive structure 106, the first polymer layer 108, and the conductive structure 110 are formed on the upper surface 101a of the glass film 102 subsequently. Thereafter, the step of removing the electrostatic chuck 100 does not produce the warping phenomenon caused by the problem of stress in a prior art. Therefore, the problems of flexibility and warping can be avoided in the manufacturing method of the circuit board structure of the embodiment, thereby improving the reliability and yield of the product. Additionally, the polymer material is used as a dielectric layer of the circuit board in the embodiment, and the polymer material has a lower coefficient of thermal expansion and a less amount of out gas. Thus, the dimensional stability of the circuit board of the embodiment is better, which is hardly affected by an ambient temperature, thereby improving the reliability.

Additionally, after removing the electrostatic chuck 100, the manufacturing method of the circuit board structure of the embodiment may optionally perform a bumping process, so as to form a plurality of bumps (not shown) on the second circuit layer 110b. The first circuit board structure 1 may be electrically connected onto an external circuit (not shown) by the bumps.

FIG. 2A to FIG. 2D are schematic cross-sectional diagrams of a manufacturing process of a circuit board structure according to a second embodiment of the invention.

Figure 2A:
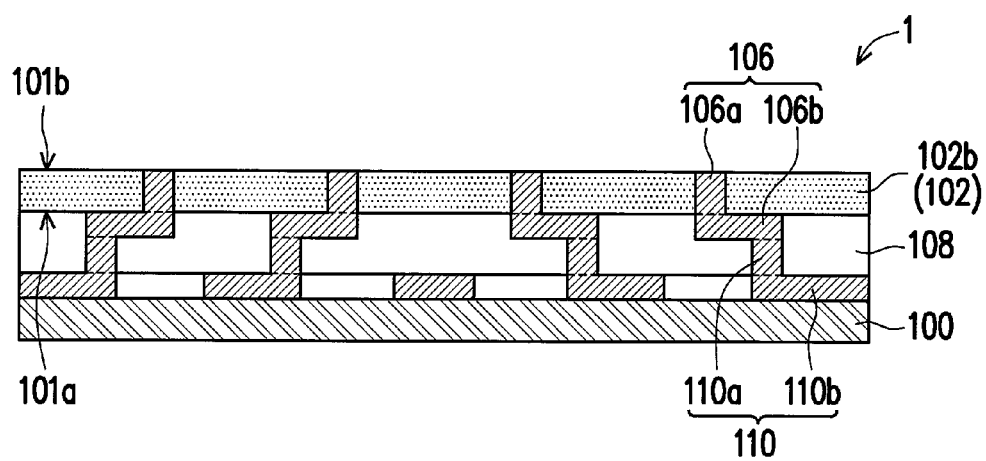
FIG. 2A to FIG. 2D are schematic cross-sectional diagrams of a manufacturing process of a circuit board structure according to a second embodiment of the invention.

Referring to FIG. 1H and FIG. 2A, the first circuit board structure 1 of FIG. 1H is flipped on the electrostatic chuck 100, such that the lower surface 101b of the glass film 102 is upward. Thereafter, the first circuit board structure 1 is absorbed by electrostatic force (more particularly, the first circuit board structure 1 is absorbed on the second circuit layer 110b), such that the first circuit board structure 1 is held on the electrostatic chuck 100 without warping.

Figure 2B:
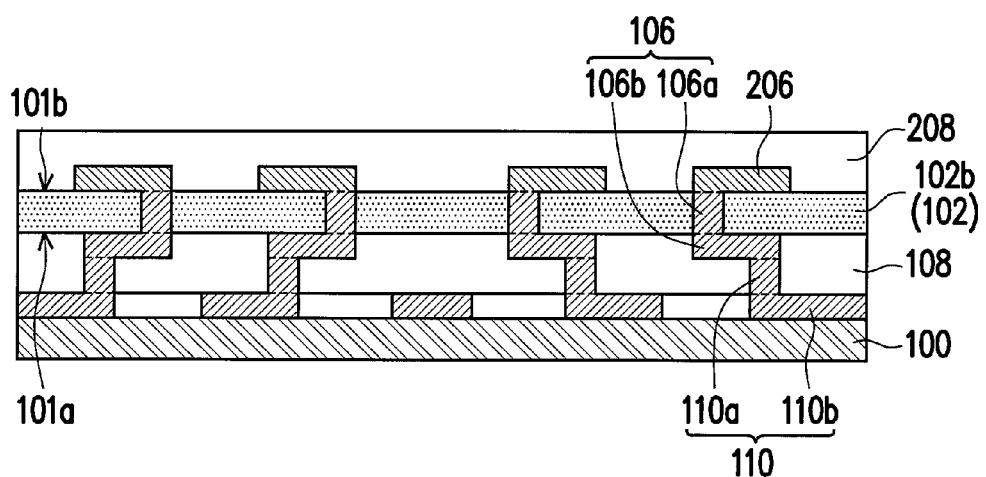

Referring to FIG. 2A and FIG. 2B, a third circuit layer 206 is formed on the lower surface 101b of the glass film 102, such that the third circuit layer 206 is electrically connected with the first conductive vias 106a. A material and a forming method of the third circuit layer 206 is similar to the material and the forming method of the first circuit layer 106b in FIG. 1E, and is not described in detail here.

Then, a second polymer layer 208 is formed on the third circuit layer 206. The second polymer layer 208 covers a surface of the third circuit layer 206 and the lower surface 101b of the glass film 102. A material and a forming method of the second polymer layer 208 is similar to the material and the forming method of the first polymer layer 108 in FIG. 1F, and is not described in detail here.

Figure 2C:
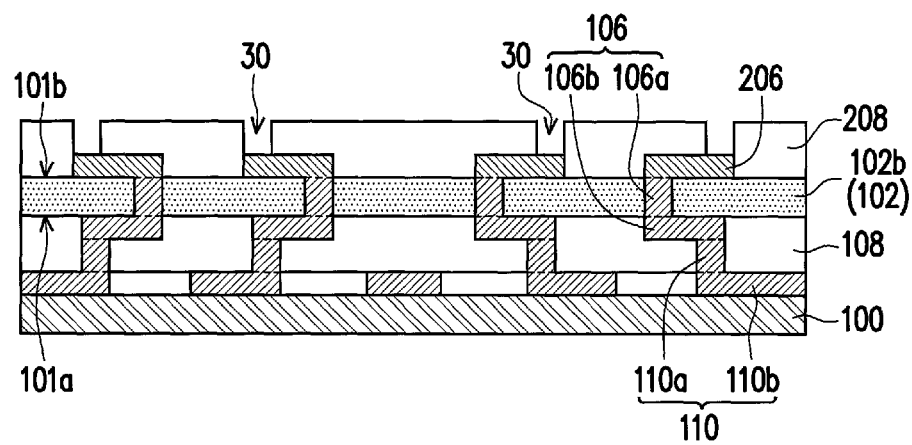

Referring to FIG. 2B and FIG. 2C, a patterned mask layer (not shown) is formed on the second polymer layer 208. Thereafter, the patterned mask layer is used as a mask to perform a lithography process, so as to form a plurality of third via holes 30 in the second polymer layer 208. A portion of the surface of the third circuit layer 206 is exposed by the third via holes 30.

Figure 2D:
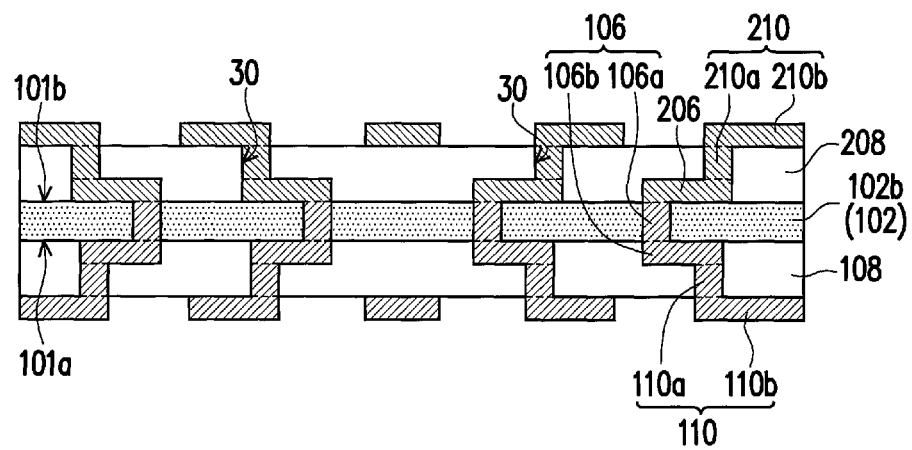

Referring to FIG. 2C and FIG. 2D, a seed layer (not shown) is formed on a surface of the second polymer layer 208 and on a surface of the third via hole 30, and an electroplating process or an electroless plating process is performed, so as to form a conductive structure 210 on a surface of the seed layer (not shown). A material and a forming method of the conductive structure 210 is similar to the material and the forming method of the conductive structure 106 in FIG. 1E, and is not described in detail here. Similarly, the conductive structure 210 includes a third conductive via 210a filled in the third via hole 30 and a fourth circuit layer 210b disposed on the second polymer layer 208. The fourth circuit layer 210b may be electrically connected with the third circuit layer 206 by the third conductive via 210a. Thereafter, the electrostatic chuck 100 is removed to expose the surface of the second circuit layer 110b, so as to form a second circuit board structure 2.

It should be mentioned that, although only the conductive vias 106a and 110a, one layer of the polymer layer 108 and two layers of the circuit layers 106b and 110b are shown in the first circuit board structure 1 of FIG. 1H, and only the conductive vias 106a, 110a, and 210a, two layers of the polymer layers 108 and 208, and four layers of the circuit layers 106b, 110b, 206, and 210b are shown in the second circuit board structure 2 of FIG. 2D. However, the invention is not limited to. In other embodiments, numbers and connection methods of the conductive via, the polymer layer and the circuit layer may be adjusted according to the needs of a designer.

Additionally, after removing the electrostatic chuck 100, the manufacturing method of the circuit board structure of the embodiment may optionally perform a bumping process, so as to form a plurality of bumps (not shown) on the fourth circuit layer 210b. The second circuit board structure 2 may be electrically connected onto an external circuit (not shown) by the bumps.

In summary, the invention provides the thinner glass film on the electrostatic chuck. Then, the laser light is irradiated to the glass film, and the etching process is performed, so as to form the plurality of via holes in the glass film. Thereafter, the conductive material is filled in the via holes, so as to form the plurality of conductive vias. After that, the circuit layer is formed on the glass film, and the electrostatic chuck is removed. In other words, the step of de-bonding the glass substrate can be omitted in the invention, so as to complete the redistribution layer structure. Therefore, the problem of warping of the redistribution layer structure caused by the stress generated from de-bonding can be avoided in the invention, thereby improving the reliability and yield of the product.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a circuit board structure, comprising:
   providing a glass film having an upper surface and a lower surface, and the lower surface of the glass film being directly disposed on an electrostatic chuck;
   forming a plurality of first conductive vias in the glass film, and the plurality of the first conductive vias penetrate the upper surface and the lower surface of the glass film;
   forming a first circuit layer on the upper surface of the glass film, such that the first circuit layer is electrically connected with the first conductive vias;
   forming a first polymer layer on the first circuit layer, and the first polymer layer covering a surface of the first circuit layer and the upper surface of the glass film;
   forming a plurality of second conductive vias in the first polymer layer, wherein the second conductive vias are electrically connected with the first circuit layer;
   forming a second circuit layer on the first polymer layer, such that the second circuit layer is electrically connected with the second conductive vias; and
   removing the electrostatic chuck, so as to form a first circuit board structure.

2. The manufacturing method of the circuit board structure according to claim 1, wherein the step of forming the first conductive vias in the glass film comprises:
   irradiating a laser light to the glass film, so as to fouls a plurality of modified regions in the glass film, wherein regions outside of the modified regions are non-modified regions;
   performing an etching process to remove the glass film in the modified regions, so as to form a plurality of first via holes in the glass film, wherein the first via hole penetrates the upper surface and the lower surface of the glass film; and
   filling a conductive material in the first via holes.

3. The manufacturing method of the circuit board structure according to claim 2, wherein an etching rate of the etching process on the modified regions is more than an etching rate of the etching process on the non-modified regions.

4. The manufacturing method of the circuit board structure according to claim 2, wherein an etching selectivity of the modified regions to the non-modified regions is between 20:1 and 100:1.

5. The manufacturing method of the circuit board structure according to claim 1, wherein the step of forming the second conductive vias in the first polymer layer comprises:
   forming a patterned mask layer on the first polymer layer;
   using the patterned mask layer as a mask to perform a lithography process, so as to form a plurality of second via holes in the first polymer layer; and
   filling a conductive material in the second via holes.

6. The manufacturing method of the circuit board structure according to claim 1, wherein a material of the first polymer layer comprises a photosensitive material, and the photosensitive material comprises a chemically amplified photosensitive material.

7. The manufacturing method of the circuit board structure according to claim 1, wherein a thickness of the glass film is between 5 micrometers and 100 micrometers.

8. The manufacturing method of the circuit board structure according to claim 1, after removing the electrostatic chuck, further comprising performing a bumping process, such that a plurality of bumps are formed on the second circuit layer.

9. The manufacturing method of the circuit board structure according to claim 1, after removing the electrostatic chuck, further comprising:
   flipping the first circuit board structure on the electrostatic chuck, such that the lower surface of the glass film is upward;
   forming a third circuit layer on the lower surface of the glass film, such that the third circuit layer is electrically connected with the first conductive vias;
   forming a second polymer layer on the third circuit layer, and the second polymer layer covering a surface of the third circuit layer and the lower surface of the glass film;
   forming a plurality of third conductive vias in the second polymer layer, wherein the third conductive vias are electrically connected with the third circuit layer;
   forming a fourth circuit layer on the second polymer layer, such that the fourth circuit layer is electrically connected with the third conductive vias; and
   removing the electrostatic chuck.

* * * * *